(12) United States Patent
Chien et al.

(10) Patent No.: US 9,966,499 B2
(45) Date of Patent: May 8, 2018

(54) LIGHT EMITTING DIODE STRUCTURE, LIGHT EMITTING DIODE DEVICE AND THE MANUFACTURING METHOD THEREOF

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: I-Chen Chien, Keelung (TW); Shih-Chang Hsu, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days. days.

(21) Appl. No.: 15/357,881

(22) Filed: Nov. 21, 2016

(65) Prior Publication Data
US 2017/0352778 A1 Dec. 7, 2017

(30) Foreign Application Priority Data
Jun. 3, 2016 (CN) .......................... 2016 1 0393727

(51) Int. Cl.
*H01L 33/22* (2010.01)
*H01L 33/24* (2010.01)
*H01L 33/00* (2010.01)
*H01L 33/10* (2010.01)
*H01L 33/50* (2010.01)

(52) U.S. Cl.
CPC .......... *H01L 33/0079* (2013.01); *H01L 33/10* (2013.01); *H01L 33/24* (2013.01); *H01L 33/502* (2013.01); *H01L 2933/0033* (2013.01); *H01L 2933/0058* (2013.01)

(58) Field of Classification Search
CPC ..... H01L 33/0079; H01L 33/22; H01L 33/50; H01L 22/14
USPC .............................................. 257/98; 438/28
See application file for complete search history.

(56) References Cited

U.S. PATENT DOCUMENTS

| | | | | |
|---|---|---|---|---|
| 2006/0202223 A1* | 9/2006 | Sackrison | ............... | H01L 33/22 257/99 |
| 2009/0170224 A1* | 7/2009 | Urashima | ............. | H01L 33/007 438/22 |
| 2011/0297980 A1* | 12/2011 | Sugizaki | ................. | H01L 33/38 257/98 |
| 2011/0297985 A1* | 12/2011 | Naka | ..................... | H01L 33/507 257/98 |
| 2012/0299038 A1* | 11/2012 | Hwang | ................. | H01L 33/385 257/98 |
| 2013/0309792 A1* | 11/2013 | Tischler | ............. | H01L 33/0079 438/28 |

(Continued)

*Primary Examiner* — Marcos D Pizarro
*Assistant Examiner* — Antonio Crite
(74) *Attorney, Agent, or Firm* — Li&Cal Intellectual Property (USA) Office

(57) ABSTRACT

A method for manufacturing a light emitting diode structure uses a removable prefilled layer to attach the flip-type chip on a temporary substrate. A growth substrate of the flip-type chip is removed by laser lift-off, and then the light emitting diode structure is attached to a transparent support body. Lastly, the temporary substrate and the prefilled layer are removed.

11 Claims, 5 Drawing Sheets

(56) References Cited

U.S. PATENT DOCUMENTS

| | | | | |
|---|---|---|---|---|
| 2014/0145227 A1* | 5/2014 | Hoppel | .................. | H01L 33/22 |
| | | | | 257/98 |
| 2014/0312368 A1* | 10/2014 | Lee | .................... | H01L 21/6835 |
| | | | | 257/89 |
| 2015/0263242 A1* | 9/2015 | Tomizawa | .............. | H01L 33/44 |
| | | | | 257/98 |
| 2016/0190409 A1* | 6/2016 | Kuo | ..................... | H01L 33/507 |
| | | | | 257/98 |

* cited by examiner

LIGHT EMITTING DIODE STRUCTURE, LIGHT EMITTING DIODE DEVICE AND THE MANUFACTURING METHOD THEREOF

BACKGROUND

1. Technical Field

The instant disclosure relates to a method for manufacturing a light emitting diode (LED) structure, in particular, to a method related to an LED chip without a growth substrate employing laser lift-off to be removed from the LED chip and the process for forming the same. In addition, the LED structure and device manufactured by the above method are also included.

2. Description of Related Art

Generally, in order to solve the deformation and cave-in problem which are happened in producing thin film LED chips during sapphire substrate removed by laser lift-off, an underfill material (or referred to as a buffering material) is introduced for supporting the epitaxy layer. However, the heat expansion coefficient of the underfill material and the chip is not matched and the risk in the following manufacturing process is increased.

SUMMARY

The instant disclosure provides a method for manufacturing an LED structure to solve the deformation and cave-in problem after laser lift-off.

In order to solve the above problem, an embodiment of the instant disclosure provides a method for manufacturing a light emitting diode structure, comprising: forming a prefilled layer in a gap between a flip-type chip and a temporary substrate; fixing a flip-type chip on a temporary substrate by providing a removable prefilled material to form a prefilled layer in the gap between the flip-type chip and the temporary substrate; laser lifting-off the growth substrate of the flip-type chip; adhering a support body having wavelength converting material on the above structure; and removing the temporary substrate and the prefilled layer.

In addition, the instant disclosure further provides a light emitting diode structure and a light emitting diode device comprising the light emitting diode structure for solving the deformation and cave-in problem generated after the laser lift-off process to reduce the warpage and enhance the light emitting performance of the light emitting diode device.

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

FIG. 4 is a schematic enlargement view of part A in FIG. 4.

DESCRIPTION OF THE EXEMPLARY EMBODIMENTS

Figure 1:
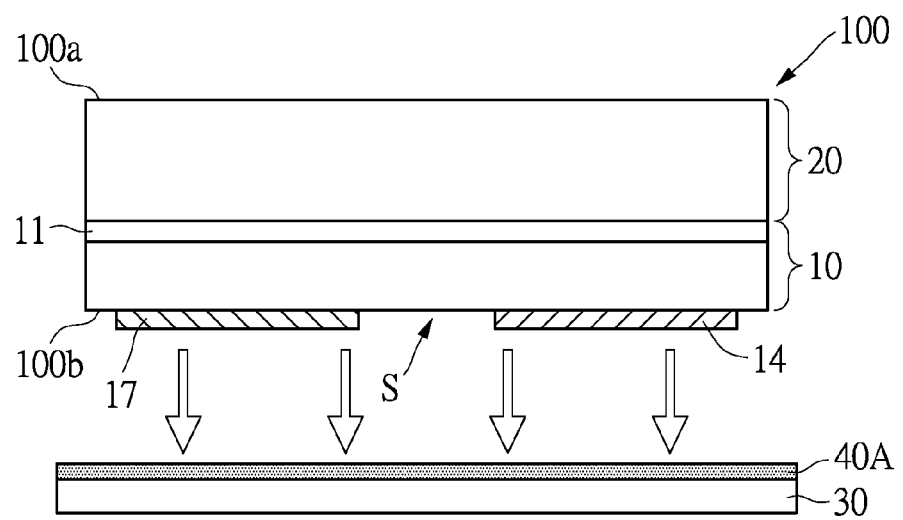
FIG. 1 is a schematic view of the fixing of the chip of the light emitting diode structure of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Please refer to FIG. 1. FIG. 1 is a schematic view of the fixing of the chip of the light emitting diode structure of the instant disclosure. The instant disclosure provides a method for manufacturing a light emitting diode structure. First, providing a flip-type chip 100, the flip-type chip has a growth substrate 20, an epitaxial structure 10 formed on the growth substrate 20 and at least a pair of chip metal pads 14, 17. A gap S is located between the pair of chip metal pads 14, 17.

In the present embodiment, the growth substrate can be a sapphire substrate, and each flip-type chip has a first surface 100a (the upper side shown in FIG. 1) and a second surface 100b (the lower side shown in FIG. 1) opposite to the first surface 100a. The side of the first surface 100a is the growth substrate 20, the side of the second surface has at least a P-contact pad 17 and at least an N-contact pad 14. A gap S is a space located between the two contact pads.

Figure 1A:
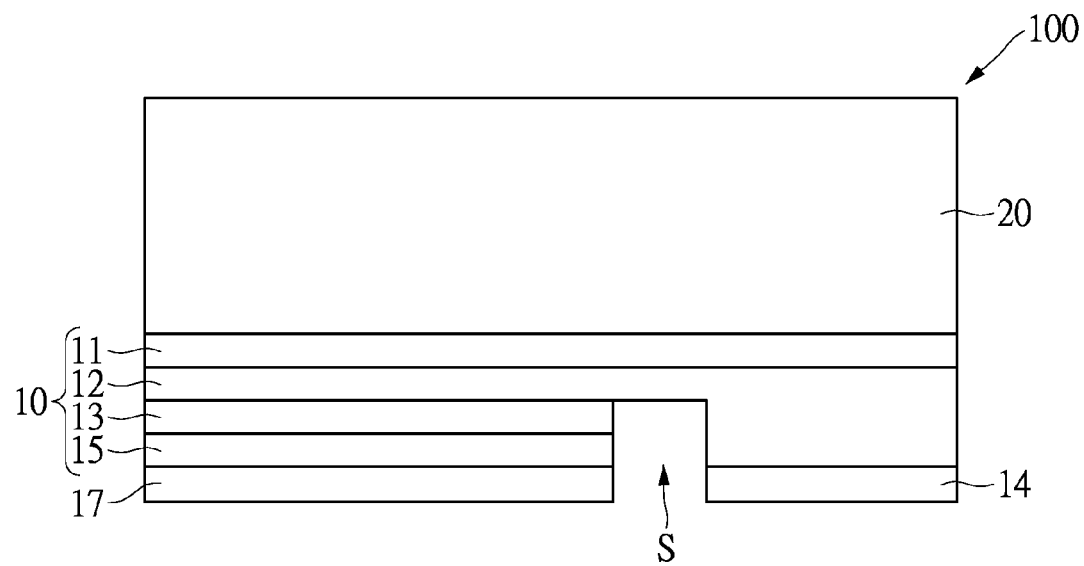
FIG. 1A is a schematic view of a flip-type structure embodiment of the flip-type chip of the instant disclosure.

Please refer to FIG. 1A. FIG. 1A is a schematic view of a flip-type structure embodiment of the flip-type chip of the instant disclosure. The epitaxial structure 10 of each flip-type chip 100 is formed on the upper surface of the growth substrate 20 and comprises a buffering layer 11, an N-type semiconductor layer 12, a light emitting layer 13, and a p-type semiconductor layer 15. The buffering layer 11 can be an undoped-GaN layer, the N-type semiconductor layer 12 can be an N-type gallium nitride layer, and the light emitting layer 13 can be a semiconductor structure of a multiple quantum well (MQW). The p-type semiconductor layer 15 can be a p-type gallium nitride layer, the n-type contact pad 14 connects to the N-type semiconductor layer 12, and the p-type contact pad 17 connects to the p-type semiconductor layer 15. In addition, an extension space of the gap S extends between the corresponding p-type semiconductor layer 15 and the N-type semiconductor layer.

The layered structure of the epitaxial structure 10 is only an example. The layered structure of the epitaxial structure 10 is not limited in the instant disclosure. For example, the buffering layer 11 can be omitted and the N-type semiconductor layer 12 is directly formed on the growth substrate 20. The p-type semiconductor layer 15 can have a metal layer or a transparent conductive oxide layer formed thereon, then the p-type contact pad 17 is formed.

Please refer to FIG. 1. The flip-type chip 100 is fixed to a temporary substrate 30 in the instant disclosure. For example, the fixing process includes coating an adhesive layer 40A on the temporary substrate 30 in advance. Afterward, the side of the flip-type chip 100 exposing the electrode contact pad (the second surface 100b) is placed on the adhesive layer 40A. The adhesive layer 40A is preferably a gel-type material without fluidity. The adhesive layer 40A can be served as the prefilled material, and provides the function of supporting and buffering. The adhesive layer can be further cured.

However, the fixing process can also include forming the adhesive layer 40A on the side of the flip-type chip 100 (the second surface 100b) in advance, then fixing such a structure with the temporary substrate 30.

The adhesive layer 40A of the instant disclosure is characterized in that it can be filled into the gap S between the N-type contact pad 14 and the p-type contact pad 17 as a support, and the coating thickness thereof must be larger than the height of the contact pads to ensure that the adhesive layer 40A can extend into the extension space of the gap S to contact the semiconductor layer, for example, the N-type semiconductor layer 12, the light emitting layer 13 and the p-type semiconductor layer 15 within the gap S. Preferably, the adhesive layer 40 is not in contact with the growth substrate 20 for increasing the convenience of removal. Preferably, no less than 70% of the gap S is filled. The adhesive layer 40 caves-in and extends during the fixing and has a ductility to attach the flip-type chip 100 on the temporary substrate 30. Ductility means that the material will not crack during the addition of a force and can be deformed. An adhesive having a viscosity of 300 to 3500 cP can provide sufficient strength and is not likely to produce adhesive residues. For example, Gel-8170 has a cone penetration of 9 mm and a viscosity of 600 cP.

For example, the adhesive layer 40A can be gallium, silicone gel, polydimethylsiloxane (PDMS), a heat-sensitive gel material or a photo-sensitive gel material, etc. Gallium is solid under room temperature and becomes a liquid after being heated to above 100° C. Silicone gel has good physical properties and buffering property after being cured, for example, silicone gel can be heated to a temperature of 80° C. PDMS is a polymer organic silicon compound and is often referred to as organic silicon. PDMS has good plasticity, flexibility and high transparency, and has low surface free energy.

Figure 2:
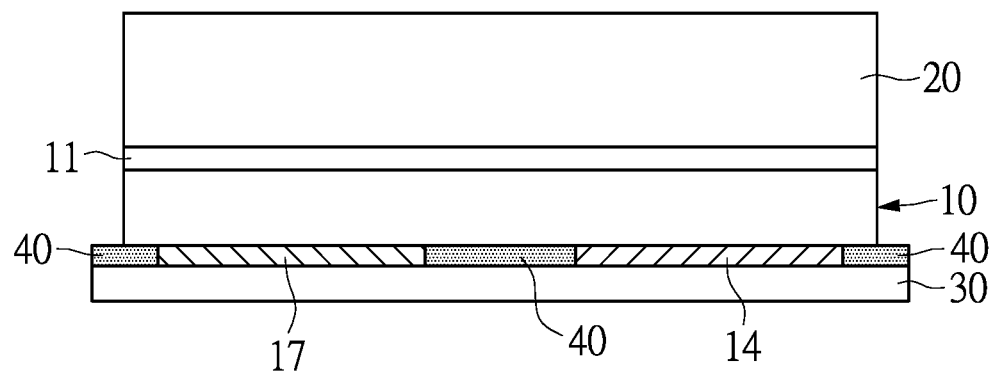
FIG. 2 is a schematic view of the fixing of the flip-type chip on the temporary substrate of the instant disclosure.

Please refer to FIG. 2. FIG. 2 is a schematic view of the fixing of the flip-type chip on the temporary substrate of the instant disclosure. During the procedure of fixing the chip, the flip-type chip 100 is slightly pressed on the adhesive layer 40A, thereby filling a removable prefilled material in the gap S between the flip-type chip 100 and the temporary substrate 30 and forming a prefilled layer 40.

Taking gallium as an example, such a material is solid under room temperature and becomes liquid after heating in 100° C. water for 10 minutes. Liquid gallium is flatly coated on the temporary substrate 30. The flip-type chip 100 is placed on liquid gallium and a small pressure is applied. The structure is cooled under −20° C. for 20 minutes. The measurement result shows that at least 95% of the gap S is filled.

In the case of silicone gel and PDMS, after being coated on the temporary substrate 30, these materials are cured and the flip-type chip 100 is placed thereon, and a small pressure is applied. The measurement shows at least 70% of the gap S is filled.

Figure 3:
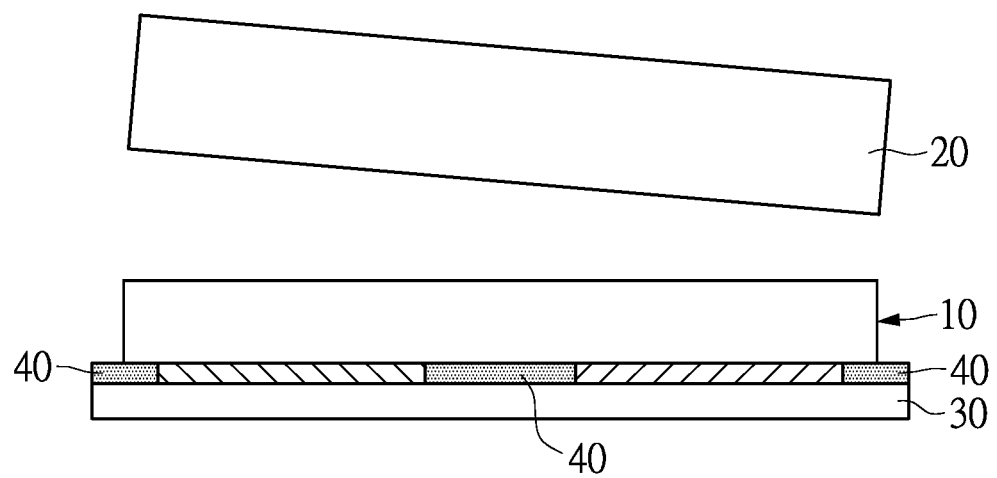
FIG. 3 is a flow diagram of the lift-off process of the flip-type chip of the instant disclosure.

Please refer to FIG. 3. FIG. 3 is a flow diagram of the lift-off process of the flip-type chip of the instant disclosure. The second step of the method provided by the instant disclosure is laser lifting-off the growth substrate 20 of the flip-type chip 100. Preferably, a chip-scale laser lift-off is used to prevent too much press from being generated by the die-scale laser lift-off process leading to serious warpage of the whole die. For example, the present embodiment employs an ultra-violet laser such as a KrF excimer laser having a wavelength of 248 nm. The advantage of such a laser is that the GaN has larger absorption coefficient towards the 248 nm excimer laser and so the laser energy is mostly absorbed at the interface. In contrast thereto, the GaN has smaller absorption coefficient toward a Nd:YAG laser (neodymium-doped yttrium aluminum garnet laser) having a wavelength of 355 nm, and the penetration depth is larger leading to the formation of the defects in the material.

For example, when the growth substrate 20 is a sapphire substrate, a laser is focused on the gallium nitride layer and the sapphire substrate is lifted-off by suitable laser energy such as energy from 50 to 1100 mJ (micro Joule). Taking a 45 Mil flip-type chip as an example, laser energy of 950 mJ is able to achieve complete lift-off. Insufficient energy would lead to incomplete lift-off and the light emitting layer would be damaged. In addition, the size of the laser beam must be slightly larger than the size of the flip-type chip to be lifted-off, preferably, the side length of the laser beam is larger than that of the flip-type chip for at least 40 micrometers (m). Taking a 45 Mil flip-type chip as an example, the chip has a side length of 1143 micrometers and a length of 60 micrometers is set for each side, the laser beam can have a size of 1260 micrometers for ensuring the complete radiation of the sample by the laser beam. Since the laser energy satisfies Gaussian distribution, uneven energy would lead to chip damage and hence, the position of the light source is adjusted based on different conditions.

Figure 4:
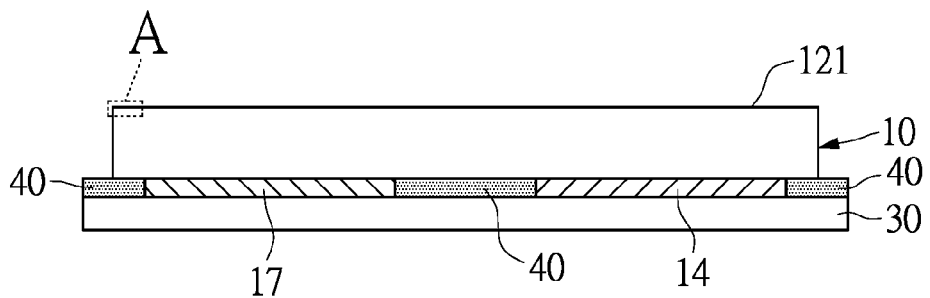
FIG. 4 is a schematic view of the roughened epitaxial structure of the flip-type chip of the instant disclosure.
Figure 4A:
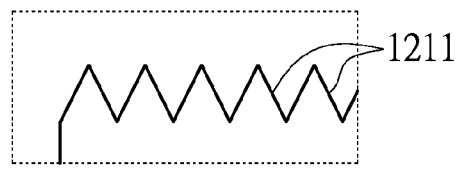
FIG. 4A is the enlargement of the part A in FIG. 4.

Please refer to FIG. 4 and FIG. 4A. FIG. 4 is a schematic view of the roughened epitaxial structure of the flip-type chip of the instant disclosure, and FIG. 4A is the enlargement of the A part in FIG. 4. The third step of the method provided by the instant disclosure is roughening a semiconductor layer of the epitaxial structure 10 which is exposed after the growth substrate 20 being lifted-off, in which the semiconductor layer is the N-type semiconductor layer 12. In the present embodiment, the N-type semiconductor layer 12 is an N-type GaN layer. The step of roughening the semiconductor layer comprises: performing wet-etching by alkali hydroxides until pyramids 1211 formed on the surface of the upper surface 121 of the semiconductor layer occupy at least 20% of the surface area. When necessary, the wet-etching further comprises assisted-etching by ultraviolet light or heat for increasing the area of the pyramids 1211.

To be specific, when the semiconductor layer is lifted-off from the growth substrate, residues or die defects may be remained on the surface of the semiconductor layer. An etchant can be used to etch the semiconductor layer exposed from the surface to expose different polygonal surfaces of the crystal. Specifically, the etchant is a wet-etching or gaseous etchant comprising an acid or a base. The gaseous etchant can be a corrosive gas (such as hydrogen or chlorine) which can be used under high temperature. Wet-etching etchant can be, particularly, aqueous alkali hydroxides (such as KOH). Preferably, the etchant is aqueous alkali hydroxides. The formed polygonal surfaces can form a pyramid structure and hence, the outer surface of the semiconductor layer can have a convex structure formed by the plurality of pyramids (each is a polyhedron). According to an embodiment, the above process can remove the nitride semiconductor material by the etching process, and enable the surface with pyramids structure to face to the substrate.

For example, the wet-etching process comprises the following steps: immersing the flip-type chip 100 on which the growth substrate 20 is removed in a 3M (volume molarity, mol/L) potassium hydroxide solution for at least 10 minutes for roughening the surface of the N-type semiconductor 12 by hydroxide ions, and taking out the flip-type chip 100 and washing the flip-type chip 100 by water via ultrasonication for a predetermined time, for example, for 10 minutes. If some gallium particles remain on the flip-type chip 100, potassium hydroxide or acids such as hydrochloride (HCl) having higher concentration can be used.

Figure 4B:
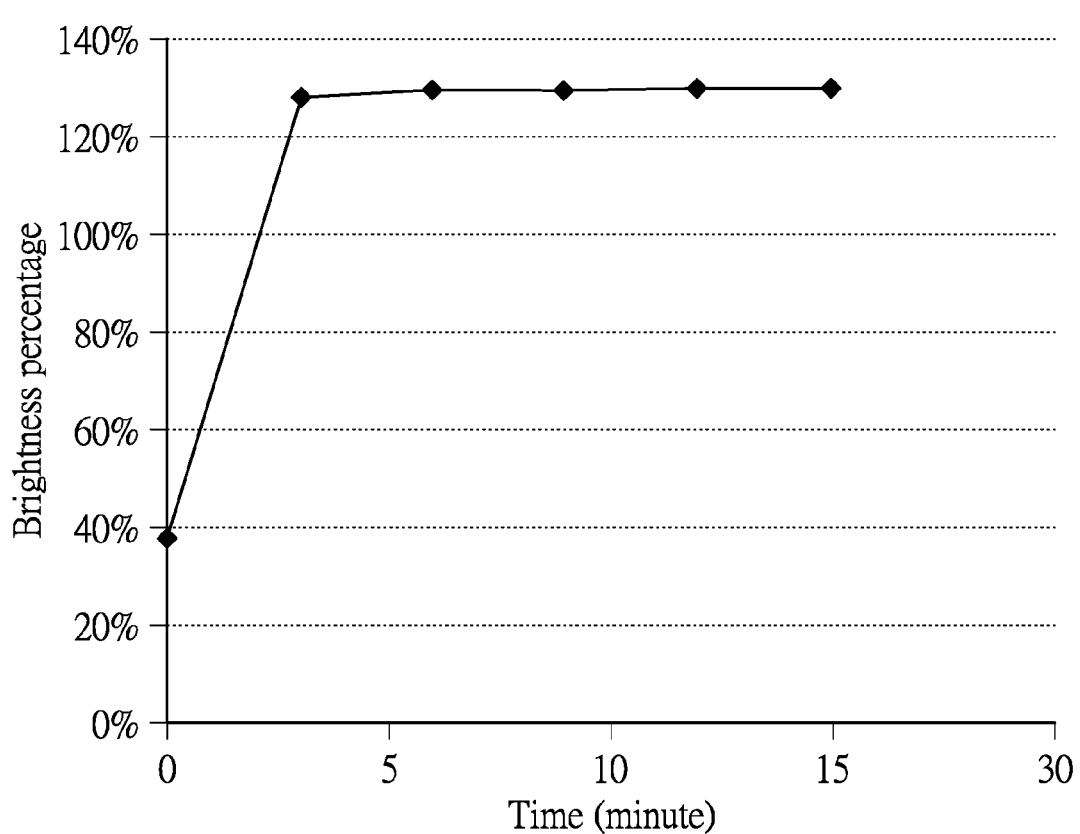
FIG. 4B is curve diagram showing the intensity improvement of the roughened epitaxial structure of the instant disclosure.

Please refer to FIG. 4B. FIG. 4B is curve diagram showing the intensity improvement of the roughened epitaxial structure of the instant disclosure. According to experiment results, when the immersing time of the flip-type chip 100 is 15 minutes (for removing the growth substrate 20), the 45 Mil flip-type chip subjected to different etching times has intensity brightness increasing to 130% compared to the flip-type chip without having been subjected to laser lift-off.

Figure 5:
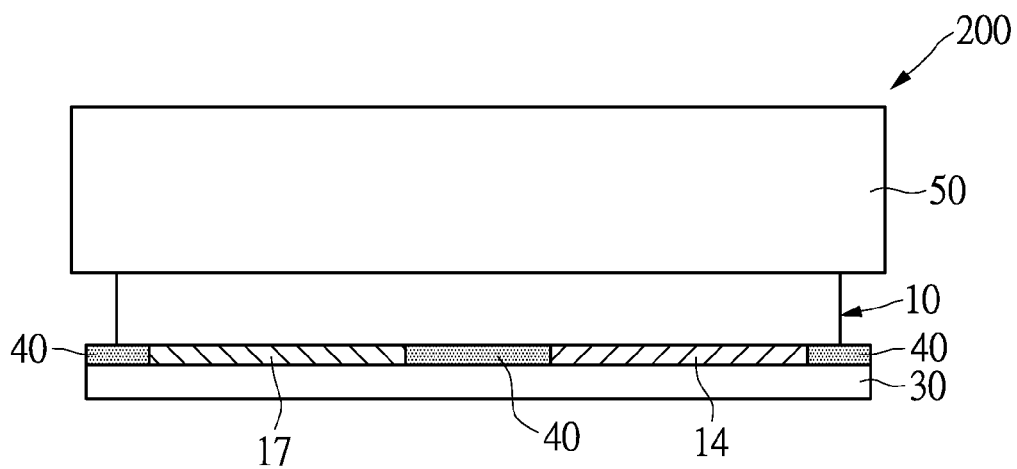
FIG. 5 is a schematic view of the flip-type chip fixed to the support body of the instant disclosure.

Please refer to FIG. 5. FIG. 5 is a schematic view of the flip-type chip fixed to the support body of the instant disclosure. The fourth step of the method provided by the instant disclosure is attaching (adhering) a transparent support body 50 on the semiconductor layer. As shown in FIG. 1A, the semiconductor layer is the N-type semiconductor layer 12 on the top surface of the epitaxial structure 10. Therefore, a light emitting diode structure 200 (without the temporary substrate 30 and the prefilled layer 40) is formed. The support body 50 used in the present embodiment is a transparent layer having a wavelength converting material such as a fluorescent sheet. The use of the support body 50 is to avoid the generation of stress after the growth substrate 20 is removed which leads to the warpage of the light emitting layer 13 by using the fluorescent sheet. In addition, by controlling the width of the fluorescent sheet to cover the epitaxial structure 10, the instant disclosure is able to prevent the blue light of the light emitting layer 13 from leaking from the side of the epitaxial structure 10 and decreasing the light emitting performance.

In the instant disclosure, the support body 50 is a fluorescent sheet or a gel material comprising a wavelength converting material.

For example, the step of attaching (or adhering) the support body 10 comprises attaching the fluorescent sheet on the epitaxial structure 10, i.e., the fluorescent sheet is attached on the N-type semiconductor layer 12 of the epitaxial structure 10 as shown in FIG. 1A. In a preferable implementation, the fluorescent sheet is a sheet-like material having mixed fluorescent powders and gels, ceramics or glasses. The Shore hardness of the fluorescent sheet after curing is larger than D40 and the thickness is larger than 150 micrometers (m) for supporting the light emitting layer 13. The size of the fluorescent sheet is larger or equal to the flip-type chip 100. The attachment can be achieved by a die bonder which applies about 120 g of force on the flip-type chip 100 (without the growth substrate 20) for ensuring a complete attachment.

Figure 5A:
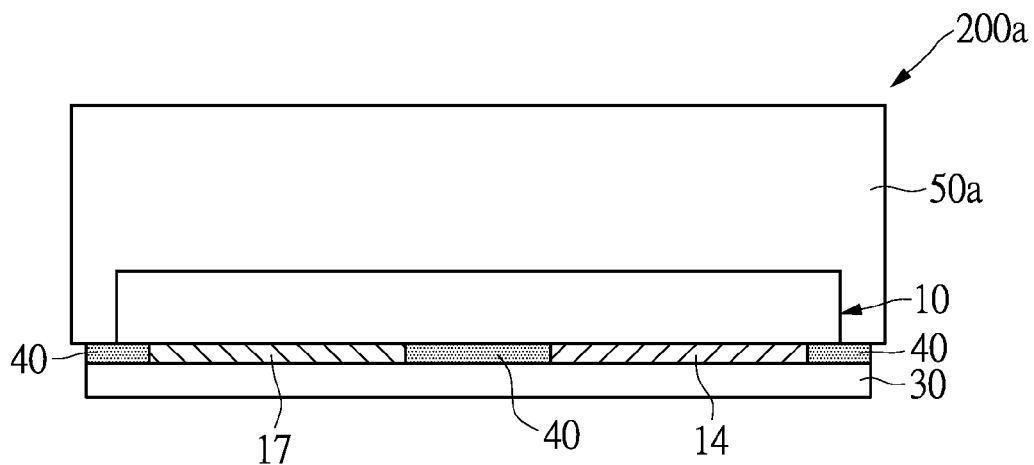
FIG. 5A is a schematic view of another embodiment of the flip-type chip fixed to the support body of the instant disclosure.

For example, in the case of a gel material being used, the procedure of attaching the support body 50 comprises directly covering the gel material on the epitaxial structure 10. A die bonder (not shown) can be used for coating the gel material having a wavelength converting material, in which the amount of the gel material must be sufficient to cover the entire flip-type chip 100 without the growth substrate 20, i.e., covering the upper surface 121 and four side surfaces. As shown in FIG. 5A, the support body 50 extends to the two sides of the epitaxial structure 10 and forms a light emitting structure 200a. In addition, since the gel material would directly contact with the flip-type chip 100, a gel material which is heat-resistant and photo-resistant must be used, for example, a silicone gel having a reflectance of 1.4.

Figure 5B:
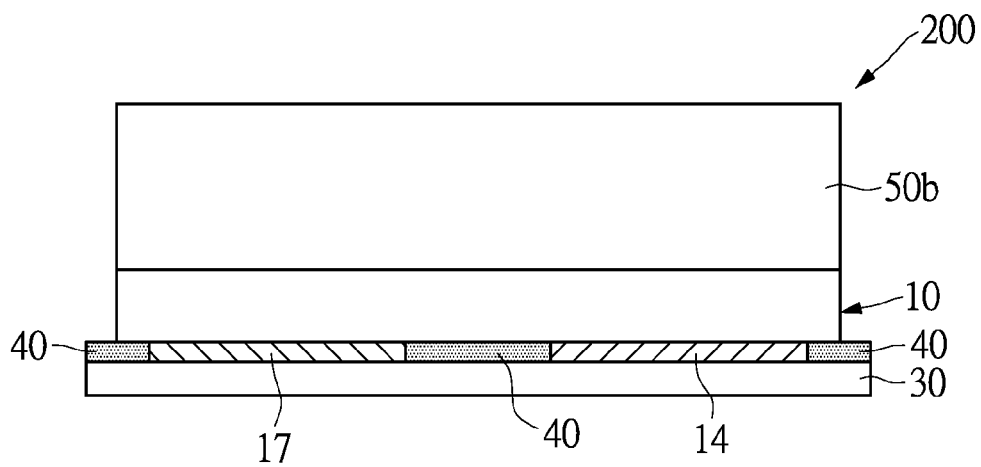
FIG. 5B is a schematic view of yet another embodiment of the flip-type chip fixed to the support body of the instant disclosure.

Please refer to FIG. 5B. FIG. 5B is a schematic view of yet another embodiment of the flip-type chip fixed to the support body of the instant disclosure. The difference between the present embodiment and the previous embodiment is that the width of the support body 50b is substantially equal to the width of the epitaxial structure 10 in the present embodiment. In the embodiments of the instant disclosure, the width of the support body can be larger than or equal to the width of the epitaxial structure 10.

After removing the growth substrate 20, the light emitting layer 13 will generate warpage. Therefore, the transparent support bodies 50, 50a, 50b having fluorescent powder (wavelength converting material) can solve this problem which is induced by stress, and by controlling the widths of the transparent support bodies, the blue light of the light emitting layer 13 is prevented from leaking. In addition, after removing the growth substrate 20, the thickness of the chip can be reduced by 150 μm and the side light emitting effect can be further avoided. In addition, since the light emitting layer 13 of the chip has a thickness of less than 10 μm, the blue light is almost emitted from the front side and can be converted into white light.

Figure 6:
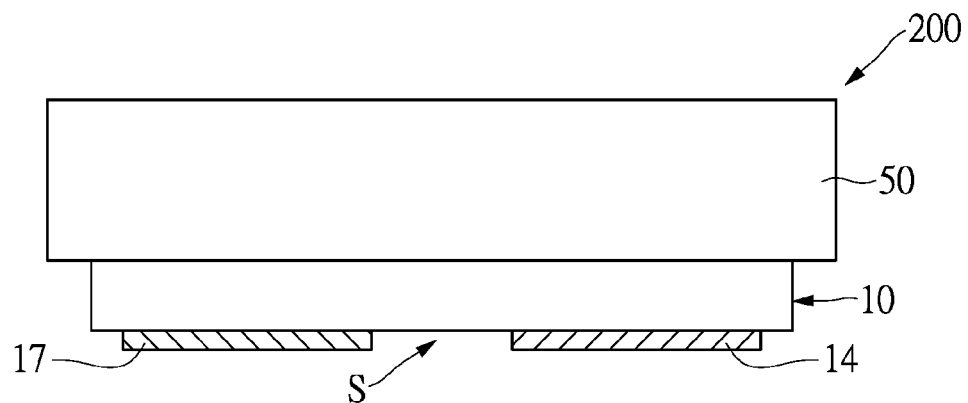
FIG. 6 is a schematic view of the removing of the temporary substrate and the prefilled layer of the instant disclosure.

Please refer to FIG. 6. FIG. 6 is a schematic view of the removing of the temporary substrate and the prefilled layer of the instant disclosure. The fifth step of the method provided by the instant disclosure is removing the temporary substrate 30 and the prefilled layer 40. For example, when the prefilled layer 40 is made of gallium, the procedure of removing the temporary substrate comprises the following steps: impregnating the epitaxial structure 10 fixed on the temporary substrate 30 by the gallium as the prefilled layer 40 in water of 100° C. for a predetermined time; and optionally observing if there is any gallium residue, if a gallium residue is presented, washing a surface of the light emitting diode structure with hydrochloride when a residue of the gallium is remained on the surface of light emitting diode structure. The advantages of the above procedure are that the temporary substrate 30 is easy to remove since it has a relatively low melting point that enables treatment with hot water, and the temporary substrate can be used repeatedly.

For example, when the prefilled layer 40 is made of silicone gel, the procedure of removing the temporary substrate 30 comprises the following step: picking up the light emitting diode 200 from the silicone gel. The advantages of the above procedure are that the temporary substrate 30 is easy to remove by directly picking it up, and the temporary substrate can be used repeatedly. The viscosity of the silicone gel is preferably from 300 cP to 3500 cP.

For example, when the prefilled layer 40 is polydimethylsiloxane, the procedure of removing the temporary substrate 30 comprises the following steps: removing the light emitting diode structure 200 from the polydimethylsiloxane by an adhesive film (not shown); and optionally observing if there is any polydimethylsiloxane residue, and washing a surface of the light emitting diode structure 200 by acetone when a residue of the polydimethylsiloxane is remained on the surface of the light emitting diode structure 200. The advantages of the above procedure are that the temporary substrate 30 is easy to remove. The polydimethylsiloxane preferably has a viscosity of from 300 cP to 3500 cP.

For example, when the prefilled layer 40 is a heat-sensitive gel material such as a thermal release tape, the procedure of removing the temporary substrate 30 comprises the following steps: heating the thermal release tape until the tape is released. Taking the Nitto 31950E from Nitto Denko as an example, heating the tape under 150° C. for 5 minutes can release the tape while curing the package gel. Afterwards, picking up the flip-type chip 100 from the thermal release tape. The advantages of the above procedure are that the temporary substrate 30 is easy to remove by directly drawing the flip-type chip 100 after the adhesive is released, and is not likely to generate adhesive residue and it is not necessary to use any solvents.

For example, when the prefilled layer 40 is a photo-sensitive gel material such as an ultra-violet light photo release tape, the procedure of removing the temporary substrate 30 comprises the following steps: radiating the ultra-violet light photo release tape by ultra-violet light until the tape is cured and released, such as radiating light having a wavelength of 365 nm and a power of 36 W/cm$^2$ for 15 to 60 seconds. Afterward, picking up the light emitting diode structure 200 from the ultra-violet tape. The advantages of the above procedure are that the temporary substrate 30 is easy to remove by directly drawing the flip-type chip 100 after the adhesive is released, and is not likely to generate adhesive residue and it is not necessary to use any solvents.

Figure 7:
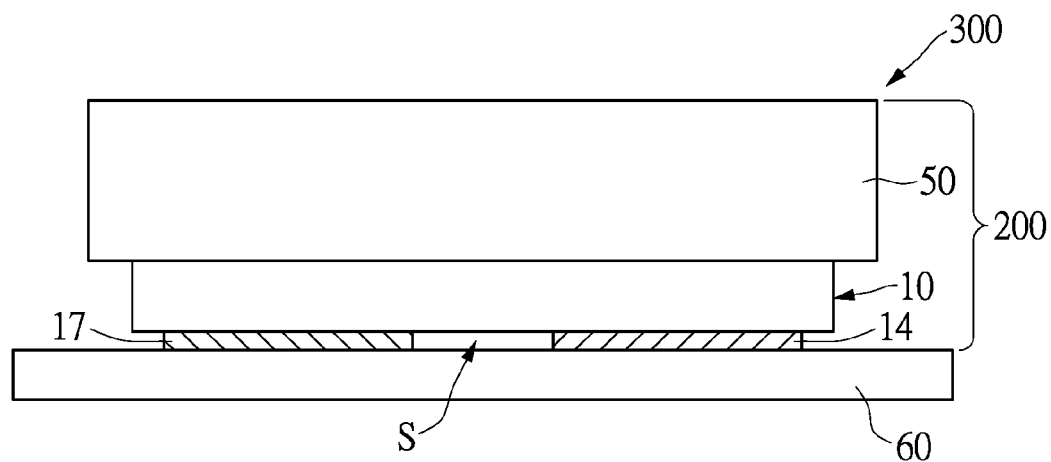
FIG. 7 is a schematic view of the light emitting diode device of the instant disclosure.

Please refer to FIG. 7. FIG. 7 is a schematic view of the light emitting diode device of the instant disclosure. The method provided by the instant disclosure further comprises fixing the light emitting diode structure 200 on a conductive substrate 60 for forming a light emitting diode device. The die-bonding process can be achieved by eutectic, welding or pressing die bonding processes. A light emitting diode device 300 is formed. For example, a plurality of light emitting diode structures 200 can be regularly arranged on the conductive substrate 60 at the same time and a bonding process is performed. The advantage is that since the light emitting diode structure 200 is supported by the support body 50 such as a wavelength converting material layer instead of the growth substrate 20 hence, the die-bonding nozzle (not shown) is able to pick up the light emitting diode structure 200 from the wavelength converting material layer.

Figure 8:
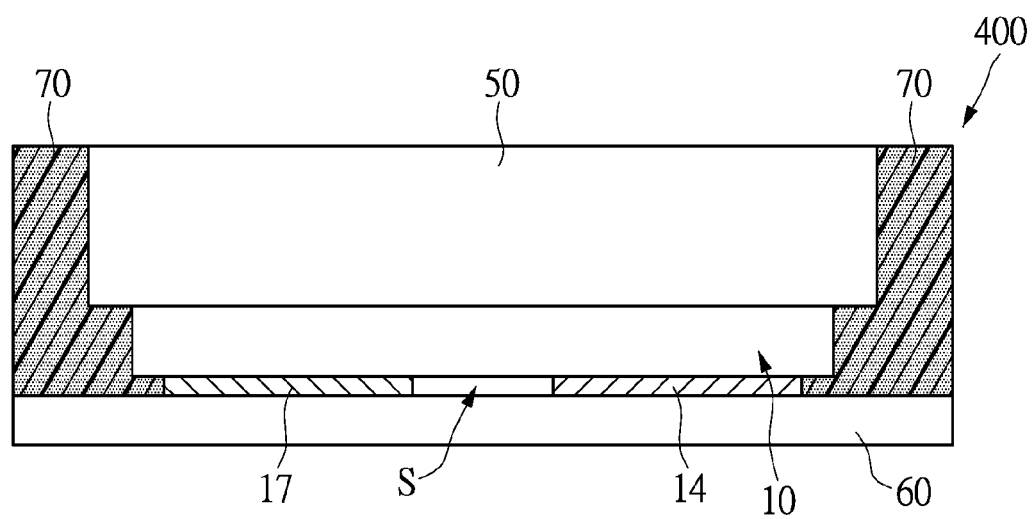
FIG. 8 is a schematic view of another light emitting diode device of the instant disclosure.

Please refer to FIG. 8. FIG. 8 is a schematic view of another light emitting diode device of the instant disclosure. The instant disclosure provides a white wall forming procedure. The present embodiment covers a resin 70 on the side surface of the light emitting diode structure 200, and a cutting process is performed for forming a light emitting diode device 400 formed by the process mentioned above. The resin forms a reflective wall structure, for example, by molding a white resin to cover the side walls of the light emitting diode structure 200 for reducing the viewing angle. Preferably, the viewing angle of the reflective wall structure is less than or equal to 120 degrees. The advantage of such procedure is that the resin can serve as a reflector and is able to reduce the viewing angle without reducing the brightness.

In summary, the characteristics and function of the instant disclosure is to reduce the overall height of the light emitting diode structure, thereby solving the problem of deformation and cave-in induced after laser lift-off process. Therefore, the problem of warpage can be solved and the light emitting performance of the light emitting diode device is increased.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A method for manufacturing a light emitting diode structure, comprising:
   providing a flip-type chip having a growth substrate and an epitaxial structure formed on the growth substrate;
   providing a removable prefilled material for fixing the flip-type chip to a temporary substrate to form a prefilled layer in a gap between the flip-type chip and the temporary substrate;
   laser lifting-off the growth substrate of the flip-type chip and exposing an semiconductor layer of the epitaxial structure;
   roughening the semiconductor layer of the epitaxial structure which is exposed;
   adhering a support body having a wavelength converting material on the semiconductor layer; and
   removing the temporary substrate and the prefilled layer;
   wherein the prefilled layer is made of polydimethylsiloxane, the step of removing the temporary substrate comprises the following steps:
   removing the light emitting diode structure from the polydimethylsiloxane by an adhesive film; and
   washing a surface of the light emitting diode structure with acetone when a residue of the polydimethylsiloxane is remained on the surface of the light emitting diode structure.

2. The method according to claim 1, wherein the step of adhering the support body on the semiconductor layer comprises the following step:
   covering a gel material having the wavelength converting material on the epitaxial structure and curing the gel material to form the support body fixed to the epitaxial structure, wherein the hardness of the support body is larger than Shore D40 after curing.

3. A light emitting diode structure, the light emitting diode structure is manufactured by the method according to claim 1.

4. The method according to claim 1, wherein the step of roughening the first surface of the semiconductor layer of the epitaxial structure comprises at least one of the following steps:
   performing wet-etching by alkali hydroxides until a plurality of pyramids formed on the first surface of the semiconductor layer occupies at least 20% of the surface area; and performing ultra-violet light or heat assisted etching for increasing the area of the pyramids.

5. The method according to claim 4, wherein the step of performing wet-etching comprises the following steps:
immersing the flip-type chip on which the growth substrate is removed in a potassium hydroxide solution; and
taking out the flip-type chip and washing the flip-type chip by water via ultrasonication.

6. The method according to claim 1, wherein the step of adhering the support body on the semiconductor layer comprises the following step:
attaching a fluorescent sheet having the wavelength converting material on the epitaxial structure, wherein the hardness of the fluorescent sheet is larger than Shore D40 after curing, and the size of the fluorescent sheet is larger than or equal to the size of the flip-type chip.

7. A light emitting diode device, comprising:
a conductive substrate; and
the light emitting diode structure according to claim 6 fixed on the conductive substrate.

8. The light emitting diode device according to claim 7, wherein the hardness of the support body is larger than Shore D40 after curing.

9. The light emitting diode device according to claim 7, wherein a plurality of pyramids formed on the surface of the semiconductor layer occupies at least 20% of the surface area.

10. The light emitting diode device according to claim 7, further comprising:
a reflective wall covering a side surface of the light emitting diode structure for achieving a view angle of the light emitting diode device of less than or equal to 120 degrees.

11. The light emitting diode device according to claim 7, wherein the width of the support body is substantially equal to the width of the epitaxial structure.

* * * * *